(12) United States Patent
Chang et al.

(10) Patent No.: US 9,053,981 B2
(45) Date of Patent: *Jun. 9, 2015

(54) HYBRID CMOS NANOWIRE MESH DEVICE AND PDSOI DEVICE

(71) Applicant: International Business Machines Corporation, Armonk, NY (US)

(72) Inventors: Josephine B. Chang, Mahopac, NY (US); Leland Chang, New York, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/194,766

(22) Filed: Mar. 2, 2014

(65) Prior Publication Data

US 2014/0175375 A1    Jun. 26, 2014

Related U.S. Application Data

(62) Division of application No. 13/328,069, filed on Dec. 16, 2011, now Pat. No. 8,709,888.

(51) Int. Cl.
*H01L 27/12* (2006.01)
*H01L 21/28* (2006.01)
(Continued)

(52) U.S. Cl.
CPC ............ *H01L 27/1203* (2013.01); *H01L 21/28* (2013.01); *H01L 29/78* (2013.01); *H01L 27/088* (2013.01); *H01L 21/845* (2013.01); *H01L 27/1211* (2013.01); *B82Y 10/00* (2013.01); *B82Y 40/00* (2013.01); *H01L 29/66439* (2013.01); *H01L 29/0673* (2013.01); *H01L 29/66795* (2013.01); *H01L 29/785* (2013.01); *H01L 29/78696* (2013.01); *Y10S 977/762* (2013.01); *Y10S 977/938* (2013.01)

(58) Field of Classification Search
CPC .................... H01L 27/1203; Y10S 977/762
USPC ............... 257/9, 288, 334, 336; 977/762, 938
See application file for complete search history.

(56) References Cited

U.S. PATENT DOCUMENTS 8,563,376 B2 * 10/2013 Chang et al. .................. 438/209

OTHER PUBLICATIONS

Prosecution History of related U.S. Appl. No. 14/194,762, Office Action mailed Nov. 14, 2014, all pages.
(Continued)

*Primary Examiner* — Edward Wojciechowicz
(74) *Attorney, Agent, or Firm* — Law Offices of Ira D. Blecker, P.C.

(57) ABSTRACT

A semiconductor hybrid structure on an SOI substrate. A first portion of the SOI substrate contains a nanowire mesh device and a second portion of the SOI substrate contains a partially depleted semiconductor on insulator (PDSOI) device. The nanowire mesh device includes stacked and spaced apart semiconductor nanowires located on the SOI substrate with each semiconductor nanowire having two end segments in which one of the end segments is connected to a source region and the other end segment is connected to a drain region. The nanowire mesh device further includes a gate region over at least a portion of the stacked and spaced apart semiconductor nanowires. The PDSOI device includes a partially depleted semiconductor layer on the substrate, and a gate region over at least a portion of the partially depleted semiconductor layer.

20 Claims, 12 Drawing Sheets

(51) Int. Cl.
*H01L 29/78* (2006.01)
*H01L 27/088* (2006.01)
*H01L 21/84* (2006.01)
*B82Y 10/00* (2011.01)
*B82Y 40/00* (2011.01)
*H01L 29/66* (2006.01)
*H01L 29/06* (2006.01)
*H01L 29/786* (2006.01)

(56) References Cited

OTHER PUBLICATIONS

Prosecution History of related U.S. Appl. No. 14/194,762, Amendment to Office Action mailed Feb. 14, 2015, all pages.

* cited by examiner

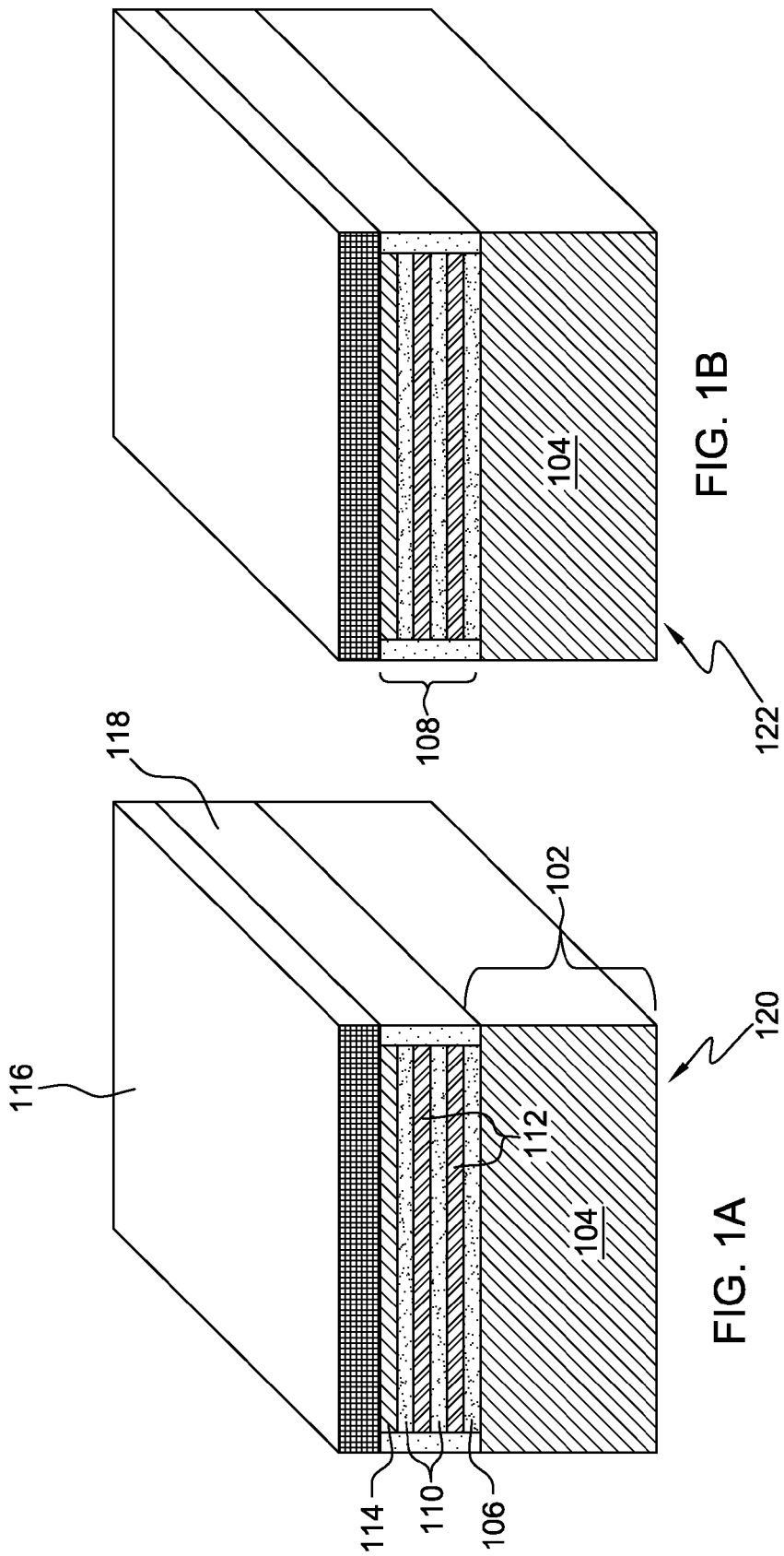

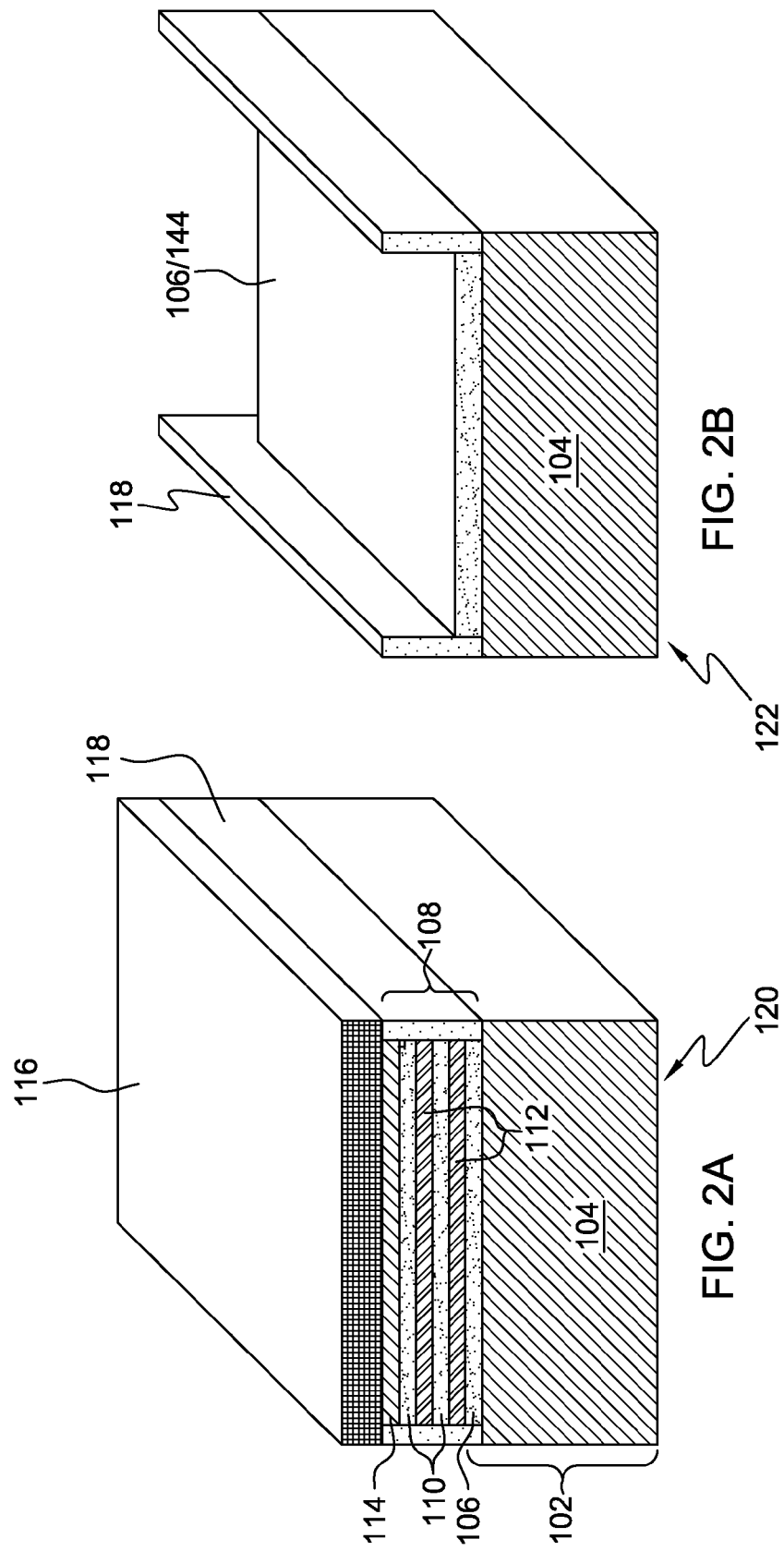

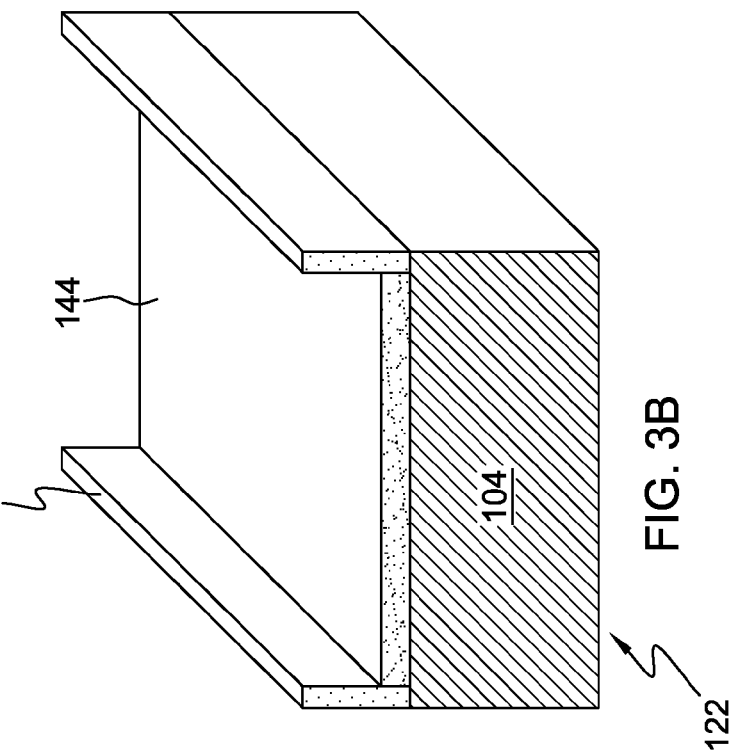
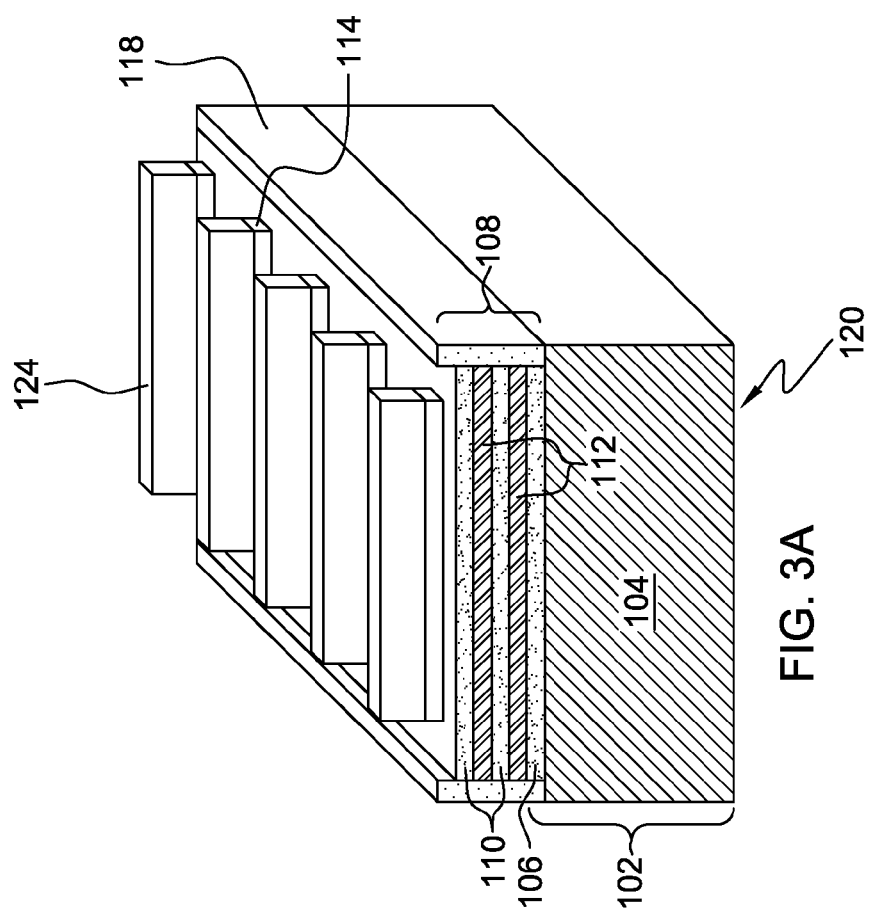

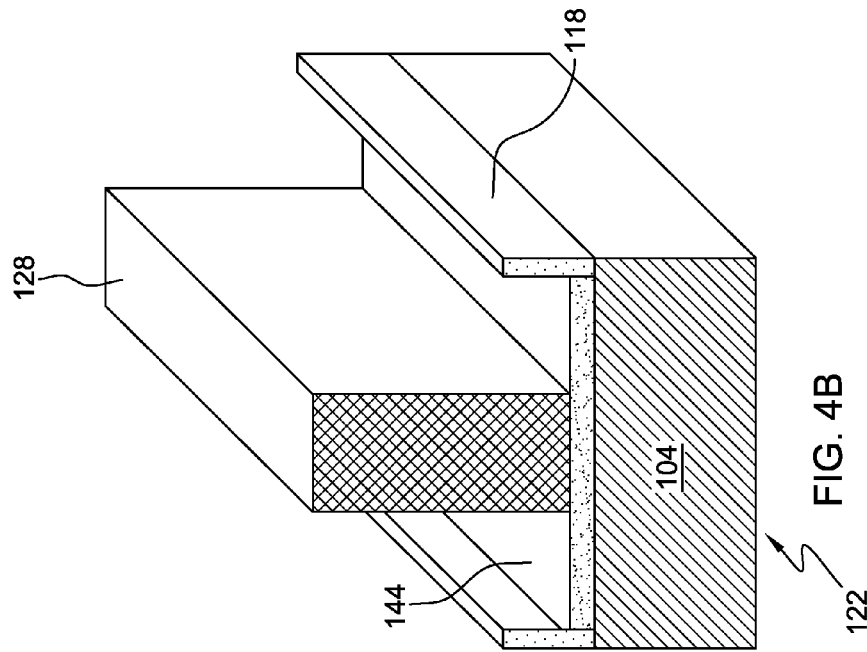
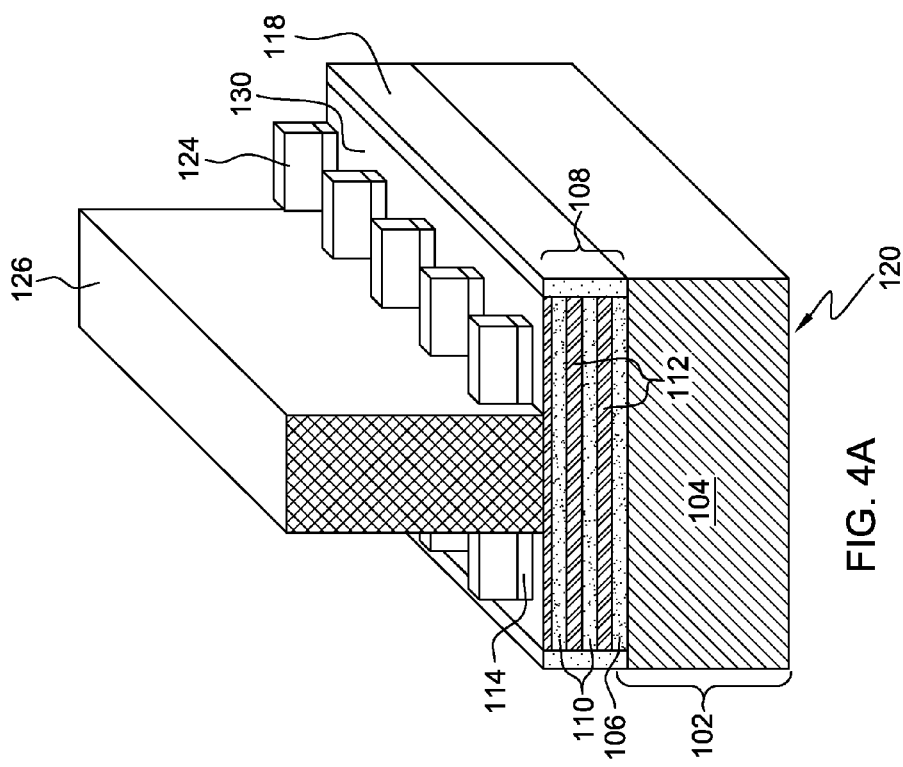
FIG. 4A
FIG. 4B

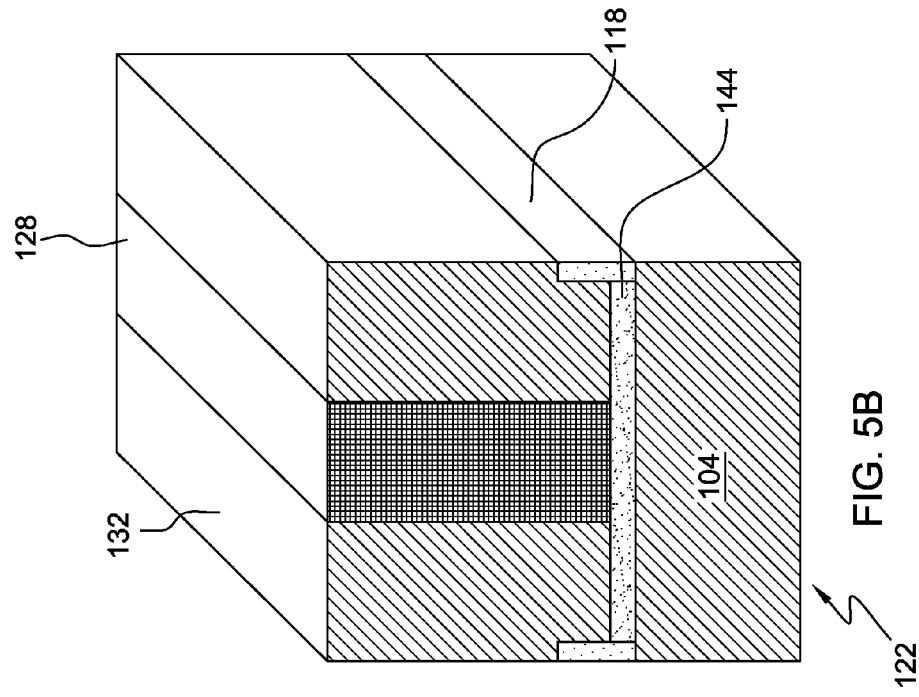
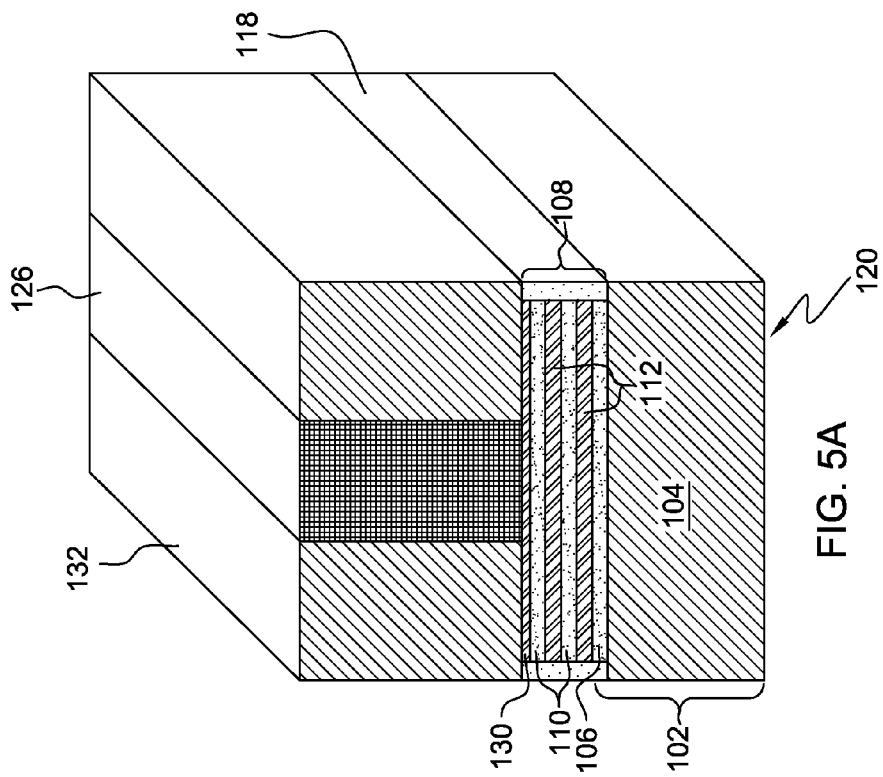

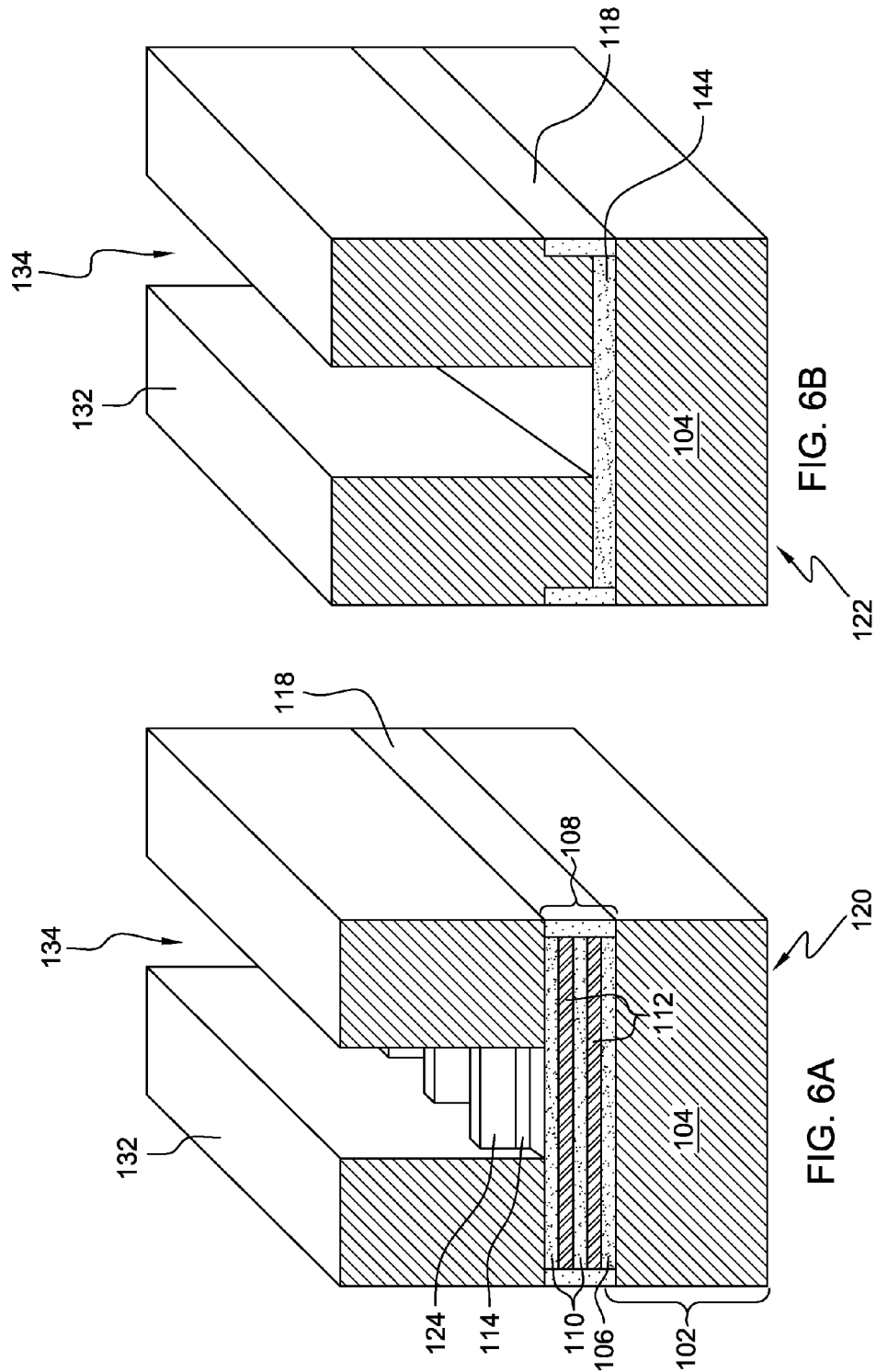

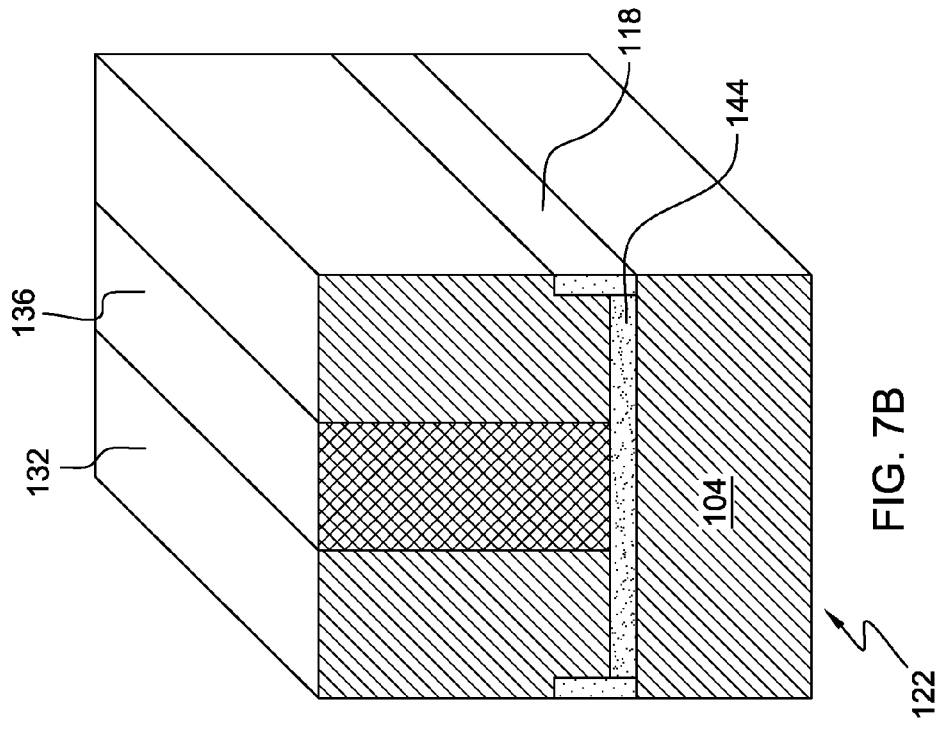
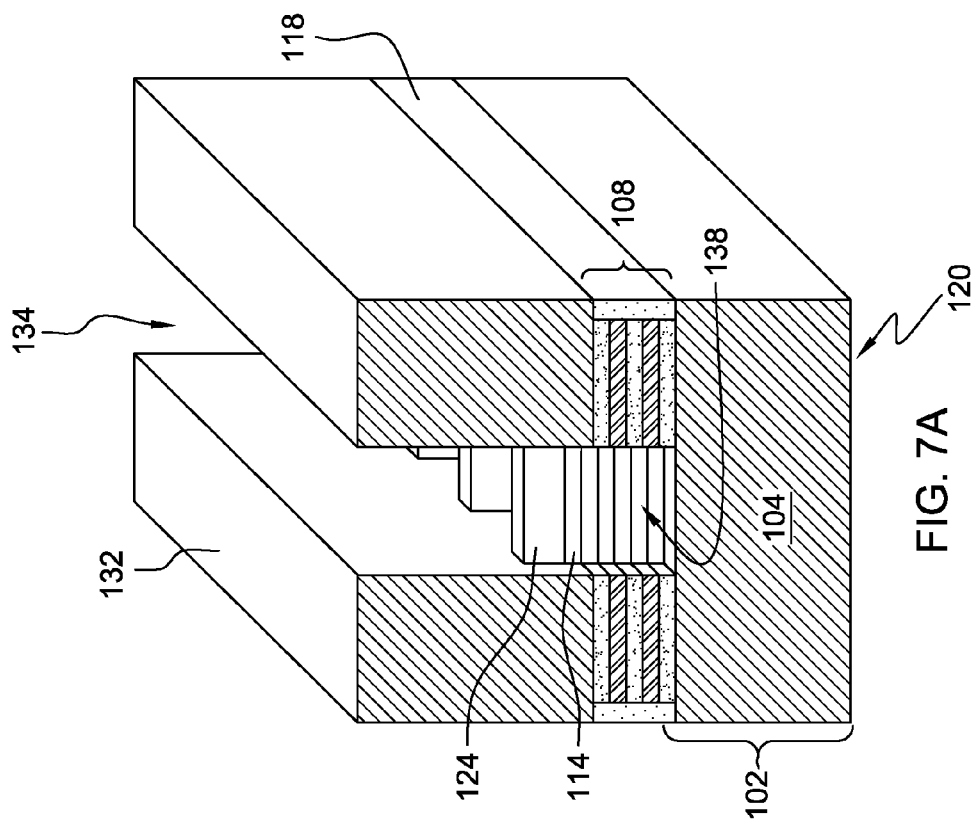

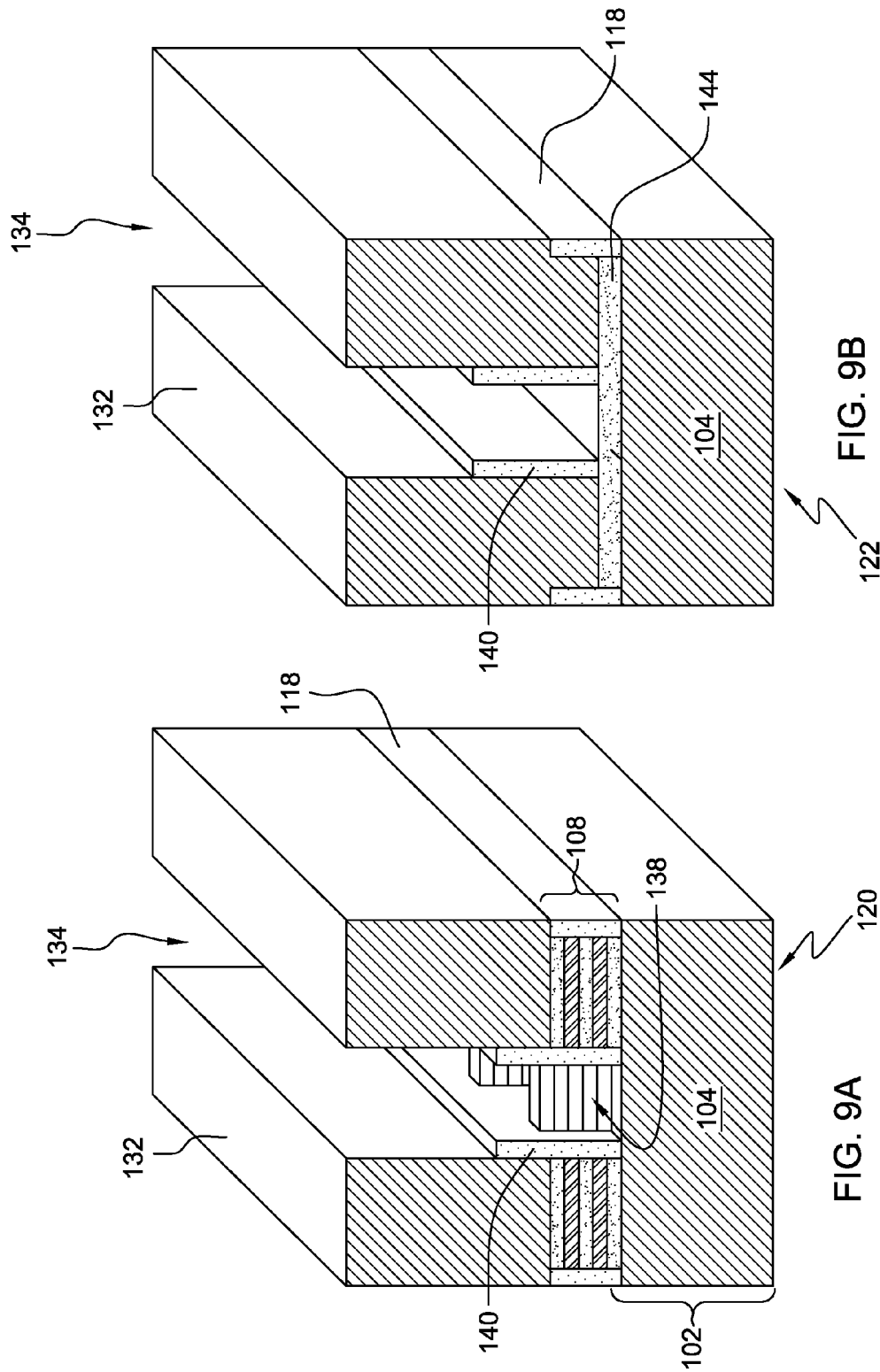

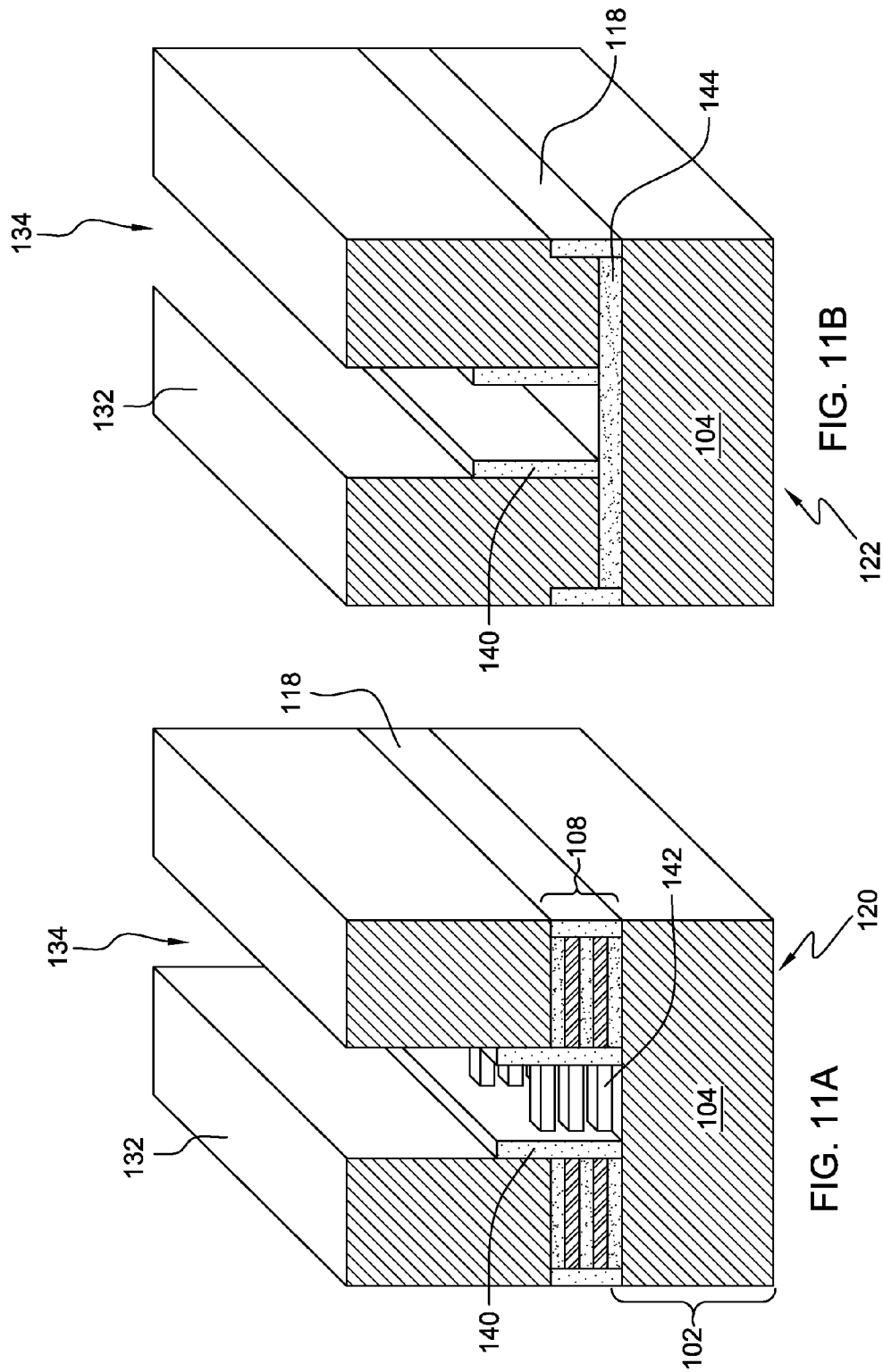

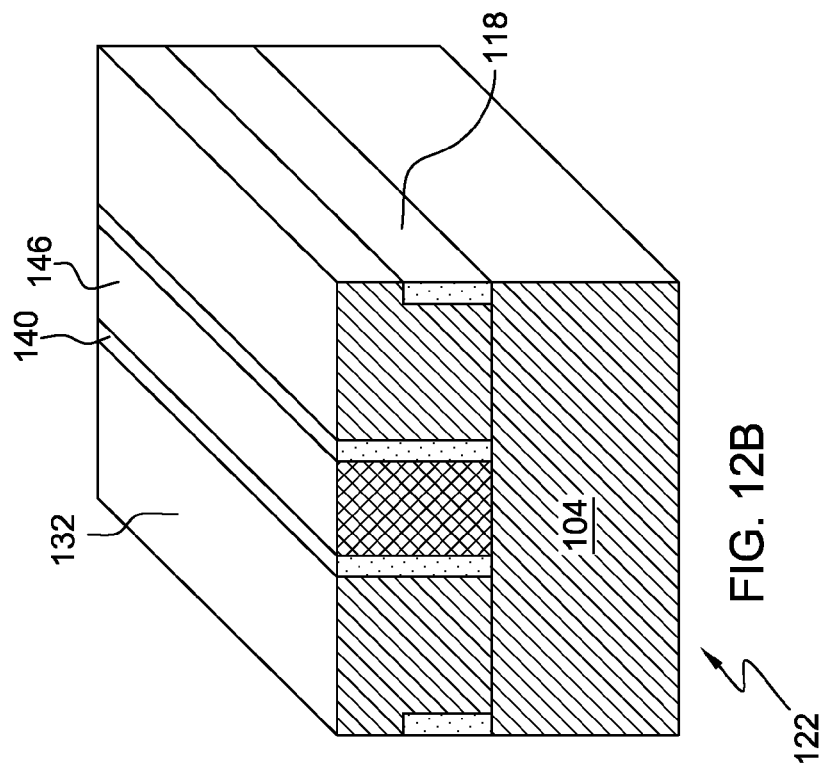
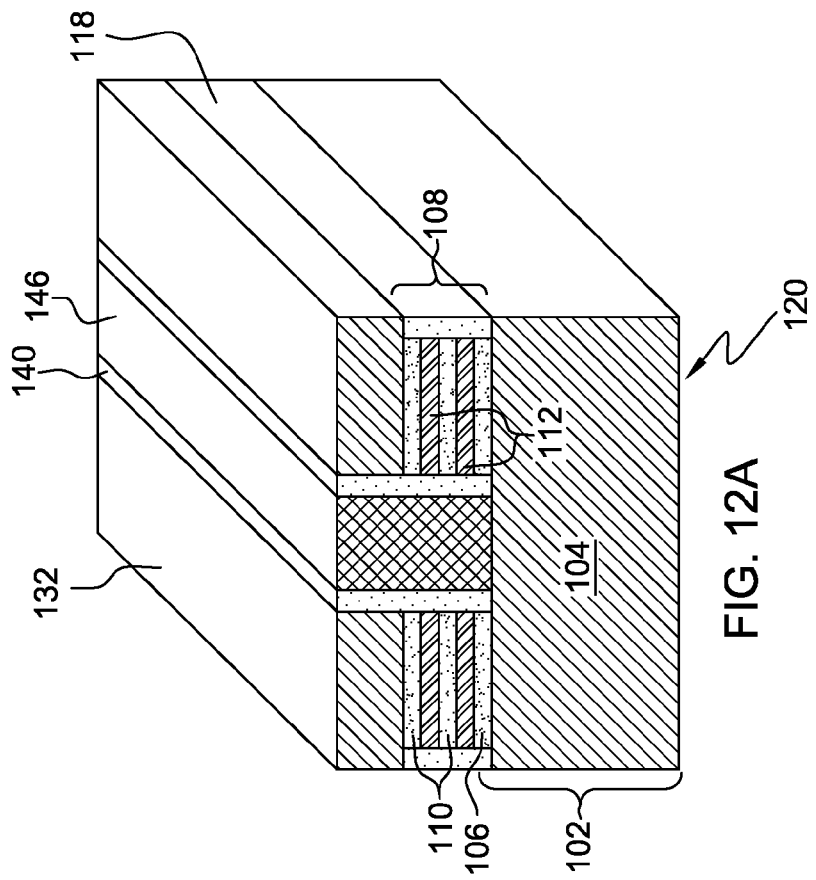

HYBRID CMOS NANOWIRE MESH DEVICE AND PDSOI DEVICE

RELATED APPLICATION

This application is a divisional of U.S. patent application Ser. No. 13/328,069 entitled "HYBRID CMOS NANOWIRE MESH DEVICE AND PDSOI DEVICE", filed Dec. 16, 2011, now U.S. Pat. No. 8,709,888, and is related to U.S. patent application Ser. No. 14/194,762 entitled "HYBRID CMOS NANOWIRE MESH DEVICE AND FINFET DEVICE," filed even date herewith, and further is related to U.S. patent application Ser. No. 13/328,015 entitled "HYBRID CMOS NANOWIRE MESH DEVICE AND FINFET DEVICE", filed Dec. 16, 2011, now U.S. Pat. No. 8,722,472, and U.S. patent application Ser. No. 13/328,106 entitled "HYBRID CMOS NANOWIRE MESH DEVICE AND BULK CMOS DEVICE", filed Dec. 16, 2011, now U.S. Pat. No. 8,563,376, the disclosures of which are incorporated by reference herein.

BACKGROUND

The present invention relates to a semiconductor structure and method and, more particularly, relates to a hybrid semiconductor structure of a nanowire mesh device and a partially depleted semiconductor on insulator device.

Due to their superior electrostatics, gate-all-around nanowire channel field effect transistors (e.g., nanowire FETs) are expected to enable density scaling beyond current planar CMOS technology. In its basic form, a nanowire FET includes a source, a drain and one or more nanowire channels between the source and the drain. A gate electrode, which wraps around the one or more nanowire channels, regulates electron flow through the nanowire channel between the source and drain.

BRIEF SUMMARY

The various advantages and purposes of the exemplary embodiments as described above and hereafter are achieved by providing, according to a first aspect of the exemplary embodiments, a semiconductor hybrid structure on a semiconductor on insulator (SOI) substrate which includes a first portion of the SOI substrate containing at least one nanowire mesh device and a second portion of the SOI substrate containing at least one partially depleted semiconductor on insulator (PDSOI) device; the at least one nanowire mesh device includes: a plurality of vertically stacked and vertically spaced apart semiconductor nanowires located on a surface of the substrate, each semiconductor nanowire having two end segments in which one of the end segments is connected to a source region and the other end segment is connected to a drain region; and a gate region including a gate dielectric and a gate conductor over at least a portion of the plurality of vertically stacked and vertically spaced apart semiconductor nanowires, wherein each source region and each drain region is self-aligned with the gate region. The at least one PDSOI device includes a partially depleted semiconductor layer on the substrate; and a gate region including a gate dielectric and a gate conductor over at least a portion of the partially depleted semiconductor layer.

According to a second aspect of the exemplary embodiments, there is provided a semiconductor hybrid structure on a semiconductor on insulator (SOI) substrate which includes a first portion of the SOI substrate containing at least one nanowire mesh device and a second portion of the SOI substrate containing at least one partially depleted semiconductor on insulator (PDSOI) device. The at least one nanowire mesh device includes a plurality of stacked and spaced apart semiconductor nanowires located on the SOI substrate, each semiconductor nanowire having two end segments in which one of the end segments is connected to a source region and the other end segment is connected to a drain region; and a gate region over at least a portion of the plurality of stacked and spaced apart semiconductor nanowires, wherein each source region and each drain region is self-aligned with the gate region. The at least one PDSOI device includes a partially depleted semiconductor layer on the substrate; and a gate region and a gate conductor over at least a portion of the partially depleted semiconductor layer.

According to a third aspect of the exemplary embodiments, there is provided an integrated circuit which includes an semiconductor hybrid structure on a semiconductor on insulator (SOI) substrate. The semiconductor hybrid structure includes first portions of the SOI substrate containing a plurality of nanowire mesh devices and second portions of the SOI substrate containing a plurality of partially depleted semiconductor on insulator (PDSOI) devices. Each of the plurality of nanowire mesh devices including: a plurality of vertically stacked and vertically spaced apart semiconductor nanowires located on a surface of the substrate, each semiconductor nanowire having two end segments in which one of the end segments is connected to a source region and the other end segment is connected to a drain region; and a gate region including a gate dielectric and a gate conductor over at least a portion of the plurality of vertically stacked and vertically spaced apart semiconductor nanowires, wherein each source region and each drain region is self-aligned with the gate region. Each of the plurality of PDSOI devices including: a partially depleted semiconductor layer on the substrate; and a gate region including a gate dielectric and a gate conductor over at least a portion of the partially depleted semiconductor layer.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A and 1B are pictorial representations of initial structures on the same semiconductor wafer which include a material stack including alternating layers of semiconductor material and sacrificial material atop a buried insulating layer of a semiconductor on insulator substrate.

FIG. 2A is a pictorial representation of the structure of FIG. 1A which has not been modified and FIG. 2B is a pictorial representation of the structure of FIG. 1B after removing a portion of the initial structure.

FIG. 3A is a pictorial representation of the structure of FIG. 2A after forming a plurality of patterned hard masks atop the material stack and FIG. 3B is a pictorial representation of the structure of FIG. 2B which has not been further modified.

FIGS. 4A and 4B are pictorial representations of the structures of FIGS. 3A and 3B after forming a dummy gate over a central portion of each of the plurality of patterned hard masks in FIG. 3A and a dummy gate over a central portion of the structure in FIG. 3B.

FIGS. 5A and 5B are pictorial representations of the structures of FIGS. 4A and 4B after forming a sacrificial material layer adjacent the dummy gates.

FIGS. 6A and 6B are pictorial representations of the structures of FIGS. 5A and 5B after removing the dummy gates to form a trench between the sacrificial material layer that previously surrounded the dummy gates.

FIG. 7A is a pictorial representation of the structure of FIG. 6A after etching a plurality of fins into the material stack and FIG. 7B is a pictorial representation of the structure of FIG. 6B after adding a blocking material.

FIGS. 9A and 9B are pictorial representations of the structures of FIGS. 8A and 8B after spacer formation within the trench formed by the sacrificial material layer.

FIG. 11A is a pictorial representation of the structure of FIG. 9A after removing the layers of sacrificial material from the fins to provide a plurality of vertically stacked and vertically spaced apart semiconductor nanowires in the trench and FIG. 11B is a pictorial representation of the structure of FIG. 9B which has not been further modified.

FIGS. 12A and 12B are pictorial representations of the structures of FIGS. 11A and 11B after formation of a gate region within the trench.

DETAILED DESCRIPTION

Figure 8B:
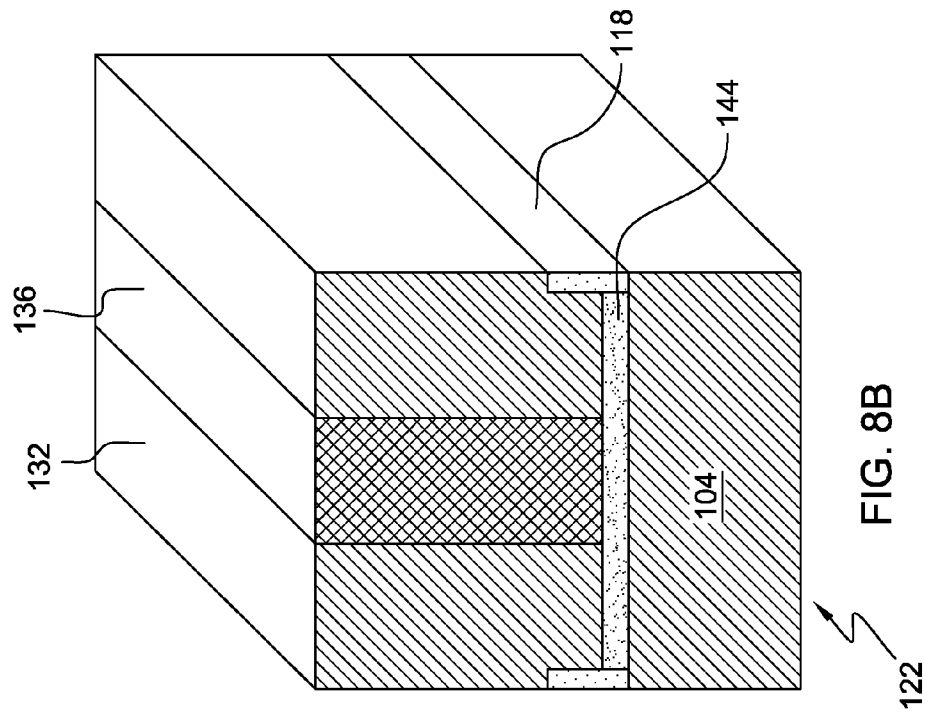
FIG. 8A is a pictorial representation of the structure of FIG. 7A after removing an upper layer from each of the patterned hard masks that lays atop each fin in the trench in the first portion and FIG. 8B is a pictorial representation of the structure of FIG. 7B which has not been further modified.

The present exemplary embodiments pertain to a hybrid CMOS structure which includes a nanowire mesh device fabricated from a plurality of vertically stacked and vertically spaced apart semiconductor nanowires and a partially depleted semiconductor on insulator (PDSOI) device. A PDSOI device is a semiconductor on insulator device with a relatively thick silicon on insulator layer of about 80 nm (nanometers). The exemplary embodiments of the hybrid structure may have particular use for applications which require large drive per unit area such as I/O (input/output) drivers.

In the following description, numerous specific details are set forth, such as particular structures, components, materials, dimensions, processing steps and techniques, in order to provide a thorough understanding of the exemplary embodiments. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIGS. 1A to 12A and FIGS. 1B to 12B of the present application which are pictorial representations depicting the basic processing flow of the exemplary embodiments of forming a nanowire mesh device and a PDSOI device, respectively, in a semiconductor on insulator wafer. The nanowire mesh device and PDSOI device are formed on the same semiconductor on insulator wafer. The nanowire mesh device and PDSOI device may be formed on the same chip. Moreover, the nanowire mesh device and PDSOI device may be adjacent to one another on the same chip or wafer or may be on separate sections of the chip or wafer. In the following description, the forming of the nanowire mesh device may be described as being formed in a first portion of the semiconductor wafer and the forming of the PDSOI device may be described as being formed in a second portion of the semiconductor wafer.

In the description and drawings that follow, one dummy gate is shown for illustrative purposes for each of the nanowire mesh device and PDSOI device. Although a single dummy gate for each of the devices is shown in the Figures, the inventive method can be employed in forming a plurality of dummy gates atop the hybrid structure, which will ultimately provide a plurality of nanowire mesh devices and PDSOI devices. The plurality of nanowire mesh devices and plurality of PDSOI devices may be employed in the formation of an integrated circuit.

The inventive process begins by first providing an initial structure that is shown in FIG. 1A for a nanowire mesh device 120 and in FIG. 1B for a PDSOI device 122. Specifically, FIGS. 1A and 1B show an initial structure that includes a processed portion of a semiconductor-on-insulator (SOI) substrate 102 including a buried insulating layer 104 and a top semiconductor layer 106. The bottom semiconductor layer of the SOI substrate 102 which is located beneath the buried insulating layer 104, is not shown for clarity. As further shown, the top semiconductor layer 106 represents the bottommost layer of a patterned material stack 108 that includes a plurality of vertically stacked semiconductor layers that are vertically spaced apart by a plurality of layers of sacrificial material such as, for example, a doped SiGe alloy. In FIG. 1, the additional layers of semiconductor material of the patterned material stack 108 are designated as 110 and the layers of sacrificial material are designed as 112. As stated above, the bottommost layer of the patterned stack is comprised of the top semiconductor layer 106 of the SOI substrate 102.

The initial structure for the nanowire mesh device 120 and PDSOI device 122 may also include an oxide layer 114 and a hard mask 116, such as a nitride, located atop the patterned material stack 108. Also shown is a nitride liner 118 that is located within an isolation trench that is formed into blanket layers of the oxide layer 114 and the patterned material stack 108 including the top semiconductor layer 106. It is noted that the trench bottom may stop atop an upper surface of the buried insulating layer 104.

The initial structure for the nanowire mesh device 120 and PDSOI device 122 shown in FIGS. 1A and 1B is formed by first providing a semiconductor-on-insulator (SOI) substrate 102 that includes a bottom semiconductor layer (not specifically shown), a buried insulating layer 104 and a top semiconductor layer 106. The top semiconductor layer 106 of the SOI substrate 102 may include any semiconductor material including but not limited to, silicon germanium (SiGe), silicon germanium carbide (SiGeC), silicon carbide (SiC), germanium (Ge) alloys, gallium arsenide (GaAs), indium arsenide (InAs), indium phosphide (InP) and other III/V and II/VI compound semiconductor materials. Typically, the top semiconductor layer 106 of the SOI substrate 102 is a silicon-containing semiconductor material including one of Si, SiGe, SiGeC and SiC. More typically, the top semiconductor layer 106 of the SOI substrate 102 includes silicon. The bottom semiconductor layer may also include any of the above mentioned semiconductor materials, with silicon be highly preferred.

The top semiconductor layer 106 of the SOI substrate 102 is a thin layer whose thickness is typically less than 100 nanometers (nm), with commercially available SOI substrates having a top semiconductor layer whose thickness typically ranges from 30 nm to 90 nm.

The buried insulating layer 104 of the SOI substrate 102 may include a crystalline or non-crystalline oxide, nitride, oxynitride or any combination thereof, including a multilayered stack of such insulators. Typically, the buried insulating layer 104 is silicon dioxide. The thickness of the buried insulating layer 104 is typically from 50 nm to 200 nm, with a thickness from 100 nm to 150 nm being more typical.

The SOI substrate 102 may be formed utilizing conventional processing known to those skilled in the art.

After providing the SOI substrate 102 including the top silicon-containing layer 106, alternating layers of a sacrificial material 112 and a semiconductor material 110 are formed over the top semiconductor layer 106 of the SOI substrate 102. Each layer of sacrificial material 112 that is formed may comprise a crystalline material including, for example SiGe. This layer may optionally be doped to form, for example, n+ or p+ doped SiGe. Phosphorus (P) and arsenic (As) are examples of n-type dopants that may be employed, while boron (B) is an example of a p-type dopant that may be employed. N-type and p-type doped regions would be needed where nFETs and pFETs, respectively, are ultimately desired. Each layer of sacrificial material 112 that is formed may be deposited utilizing an epitaxial growth process. As such, the sacrificial material 112 may be single crystalline and have crystalline dimensions close to that of layers 106 and 110. Typically, the thickness of each layer of sacrificial material would be from 5 nm to 20 nm; to minimize parasitic capacitance, the thickness should be as small as possible while still leaving enough room for two layers of gate dielectric and one layer of a gate conductor to fit in the gap formed once the sacrificial layer is removed later on in the processing.

Each layer of semiconductor material 110 that is formed may comprise the same or different semiconductor material as the top semiconductor layer 106 of the SOI substrate 102. Typically, each layer of semiconductor material 110 that is formed is comprised of a silicon-containing semiconductor, with silicon being highly preferred. The thickness of each layer of semiconductor material 110 that is formed is typically from 5 nm to 20 nm, with a thickness similar to that of layer 106 being preferred for uniform FET characteristics.

The number of layers of sacrificial material 112 and semiconductor material 110 that is formed atop the top semiconductor layer 106 of the SOI substrate 102 may vary. It is noted that the combination of the top semiconductor 106, the layers of sacrificial material 112 and the layers of semiconductor material 110 form a material stack that will be used to define the location of semiconductor nanowires in the vertical direction.

After forming the alternating layers of sacrificial material and semiconductor material, the oxide layer 114 may be formed atop the uppermost layer of semiconductor material.

Following the formation of the oxide layer 114, a trench isolation region 118 may be formed by removing non-active regions of the oxide layer 114, the alternating layers of sacrificial material 112 and semiconductor material 110 as well as the top semiconductor layer 106 of the SOI substrate 102, stopping on a surface of the buried insulating layer 104. The trench isolation region 118 may be formed by a lithographic process to define the trench isolation and then transferring the trench isolation region into the oxide layer 114, the alternating layers of sacrificial material 112, semiconductor material 110 and top semiconductor layer 106 of the SOI substrate 102 by conventional wet etching or dry etching. The trench isolation region 118 may be filled with for example, a nitride, by a conventional deposition process to result in trench isolation region 118 shown in FIGS. 1A and 1B.

Next, a hard mask 116, for example silicon nitride, is formed by a conventional process atop the structure including the patterned oxide layer 114 and the nitride trench isolation region 118. The thickness of the hard mask 116 may vary from about 5 nm to 30 nm.

Referring now to FIGS. 2A and 2B (and the following Figures), the processing for the nanowire mesh device 120 and the PDSOI device 122 are illustrated. The nanowire mesh device 120 is blocked, for example with a photoresist, to protect the nanowire mesh device 120 while the PDSOI device 122 is etched. The PDSOI device 122 may be first etched with a conventional wet or dry etch to remove the hard mask 116 over the PDSOI device 122 followed by etching of the oxide layer 114 with a conventional wet or dry etch. Thereafter, the alternating layers of sacrificial material 112 and semiconductor material 110 as well as the top semiconductor layer 106 of the SOI substrate 102 may be etched with a conventional dry etch. The etching is stopped in the top semiconductor layer 106 prior to reaching the buried insulating layer 104. It is somewhat noncritical how much of the top semiconductor layer 106 is left after the etching. Thereafter, a thin epitaxial semiconductor layer is regrown by a conventional epitaxial process on the top semiconductor layer 106 so that the top semiconductor layer, now referred to a semiconductor layer 144, has a thickness of about 5 to 200 nm and typically 60 to 90 nm. Top semiconductor layer 144 may be thicker than top semiconductor layer 106. While FIG. 2B shows the nitride isolation region present, it is not necessary to the exemplary embodiments and may be removed by conventional means if desired. Of course, while not shown in the Figures, shallow trench isolation may be typically added in a later process step to isolate PDSOI devices 122 from each other and from nanowire mesh devices 120.

After the etching described with respect to the PDSOI device 122 in FIG. 2B has been completed, the photoresist may be removed from the nanowire mesh device.

Referring now to FIG. 3A, there is shown the nanowire mesh device 120 that is formed after conventional patterning and etching to include a plurality of patterned hard masks 124 located atop the uppermost layer of semiconductor material of patterned material stack 108. Etching may be by a wet process or dry process. The etching process stops atop an uppermost layer 110 of semiconductor material of the patterned material stack 108. The PDSOI device 122 may be blocked, for example with a photoresist, while the nanowire mesh device 120 is etched. Each patterned hard mask 124, which includes a lower layer of the oxide layer 114 and an upper layer of the hard mask 116, will define the location of the semiconductor nanowires in the horizontal direction.

It is noted that each patterned hard mask 124, which may be referred to as a fin mask, is configured to have a pitch, e.g., a distance between each adjacent patterned hard mask 124, of less than 200 nm, typically between 10 nm and 200 nm, and with a distance between each adjacent patterned hard mask of between 40 nm and 50 nm being even more typical.

At this point of the inventive process, exposed surfaces of the patterned material stack 108 may be subjected to a thermal oxidation process which forms a thin (on the order of about 5 nm or less) oxide layer 130 on the exposed upper surface of the patterned material stack 108. The thin oxide layer 130 serves as an etch stop layer during subsequent processing steps of the exemplary embodiments. The resultant structure including the thin oxide layer 130 is shown in FIG. 4A.

The PDSOI device 122 in FIG. 3B is protected so that it is not oxidized. After the thin oxide layer 130 has been formed, the block over the PDSOI device 122 may be now stripped.

Referring now to FIGS. 4A and 4B, dummy gate 126 over the nanowire mesh device 120 and dummy gate 128 over the PDSOI device 122 are formed providing the structure shown illustrated in FIGS. 4A and 4B. As shown, the dummy gate 126 is formed in a central portion across each of the patterned hard masks 124. The location of the dummy gate 126, which is orthogonal to the underlying patterned hard masks 124, defines the location of the nanowire channels as well as the location of the gate. Dummy gate 128 is similarly formed over the top semiconductor layer 106 which will form the gate for the PDSOI device 122. The dummy gates 126, 128 may include polysilicon or other related sacrificial material. The dummy gates 126, 128 may be formed by first providing a blanket layer of, for example, polysilicon, atop the structures shown in FIGS. 3A and 3B utilizing a conventional deposition process including, for example, chemical vapor deposition, plasma enhanced chemical vapor deposition or chemical solution deposition. The blanket layer of dummy gate material is then patterned by lithography and etching to form dummy gates 126, 128 as shown in FIGS. 4A and 4B.

At this point of the process, a top-down implant (not shown) may optionally be used to dope the upper layer(s) of semiconductor material of patterned material stack 108 with either an n-type dopant or a p-type dopant. The conditions for this implant are well known to those skilled in the art and may vary depending of the type of dopant species employed.

The nanowire mesh device 120 and PDSOI device 122 may then be filled with a sacrificial material 132 and then planarized as shown in FIGS. 5A and 5B. The sacrificial material layer 132 which surrounds the dummy gate 126, 128 may comprise any suitable filler material such as, for example, silicon dioxide or silicon nitride. The filling step includes a conventional deposition process including for example, a high-density plasma deposition process. The planarization step includes chemical mechanical polishing (CMP) and/or grinding. It is noted that in the remaining drawings oxide layer 130 is not shown for sake of clarity.

Next, and as illustrated in FIGS. 6A and 6B, the dummy gates 126, 128 are removed from the nanowire mesh device 120 and PDSOI device 122 utilizing a chemical etching process (such as chemical downstream or KOH etching) or reactive ion etching. The etching process stops atop the patterned hard masks and the thin chemical oxide layer 130 in the nanowire mesh device 120 and on the top semiconductor layer 106 in the PDSOI device 122. The removal of the dummy gates 126, 128 forms a trench 134 between neighboring portions of the sacrificial layer material 132. Trench 134 distinguishes a channel region from regions in which the source and drain (hereinafter source/drain) regions will be subsequently formed. Note that the regions in which the source/drain regions will be subsequently formed are protected by sacrificial material layer 132 at this point of the process.

After removing the dummy gates 126, 128 from the nanowire mesh device 120 and PDSOI device 124, the PDSOI device 122 is blocked with, for example, photoresist 136. Then, the exposed portions of the patterned material stack 108 within trench 134 of the nanowire mesh device 120 are removed utilizing an etching step that anisotropically transfers the pattern formed by the sacrificial material layer 132 and patterned hard masks 124 into the patterned material stack 108. An example of such an etch would be a reactive ion etching process. The resultant structures are shown in FIGS. 7A and 7B. The remaining portions of the patterned material stack 108, protected by patterned hard masks 124, form a plurality of fins 138 as shown in FIG. 7A.

Figure 8A:
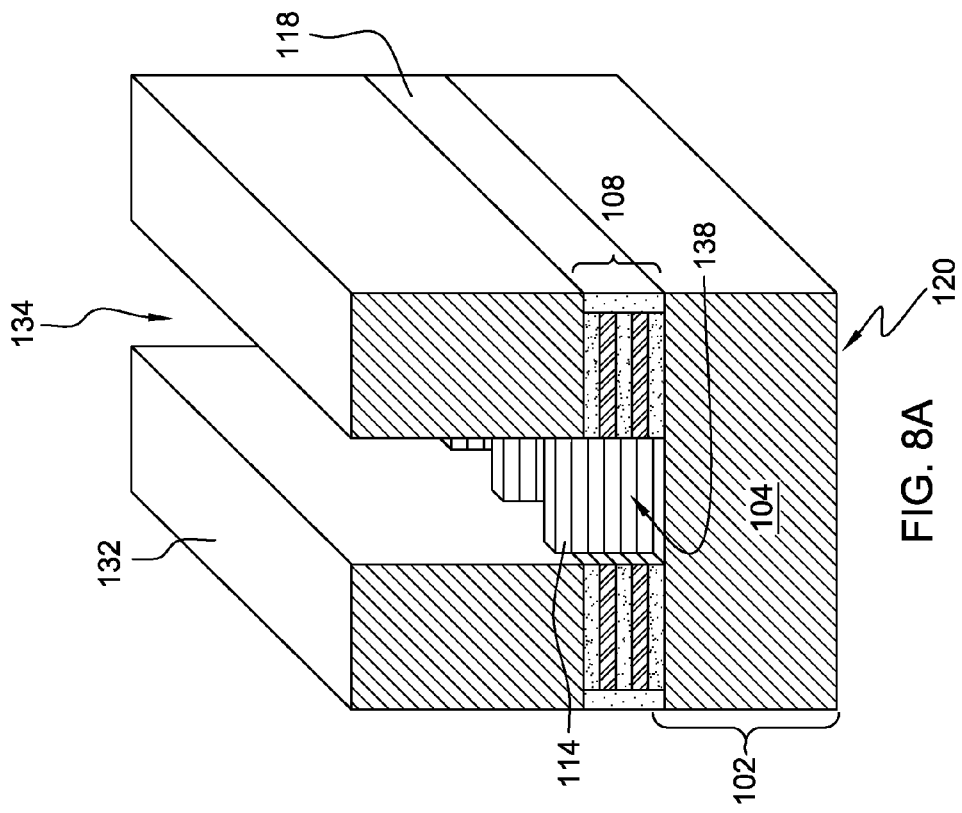

Referring now to FIG. 8A, the hard mask 116 from patterned hard masks 124 may be removed within trench 134 utilizing an etching process that selectively removes the hard mask 116 as compared to the oxide layer 114 and/or semiconductor material. It is noted that at this point, the oxide layer 114 of the patterned hard mask 124 remains atop each fin 138.

The oxide layer 114 of the patterned hard mask 124 may then be removed from each fin 138 by, for example, a dry etch process. Thereafter, the blocking layer 136 (such as photoresist) may be conventionally stripped from over PDSOI device 122. After the blocking layer 136 is removed, trench 134 over PDSOI device 122 will be reopened.

Spacers 140 may be formed within trench 134 of the nanowire mesh device 120 and PDSOI device 124 by deposition and etching. The spacers 140 may comprise any insulating material including but not limited to a nitride, an oxynitride and/or an oxide. The etching process used in forming the spacers 140 is typically performed utilizing conditions that provide for a large over etch such that no spacer material remains on the exposed sidewalls of each fin 138. That is, the spacers 140 fully cover the sidewalls of the trench 134 and may be completely absent on each fin 138. The resultant structures are shown in FIGS. 9A and 9B.

Figure 10B:
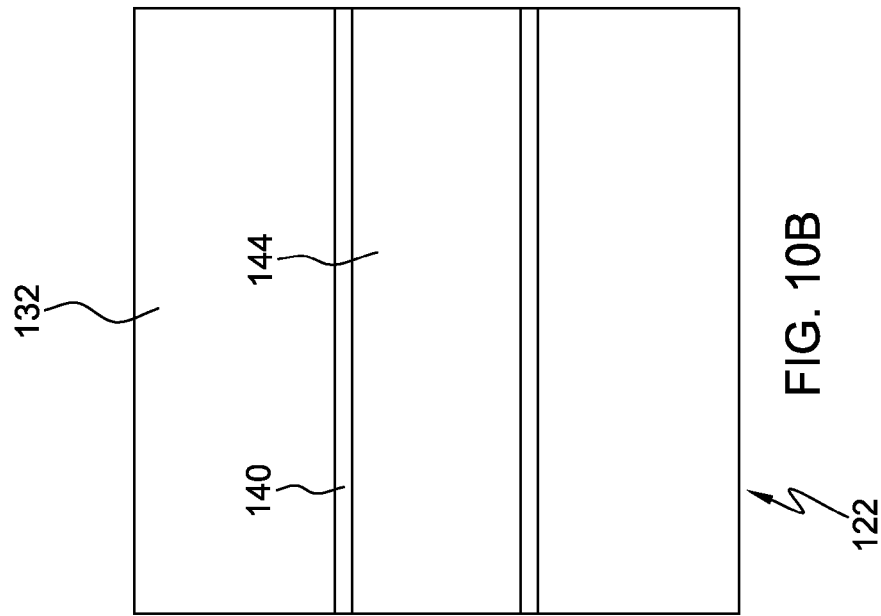
FIG. 10B is a top view of the structure of FIG. 9B.
Figure 10A:
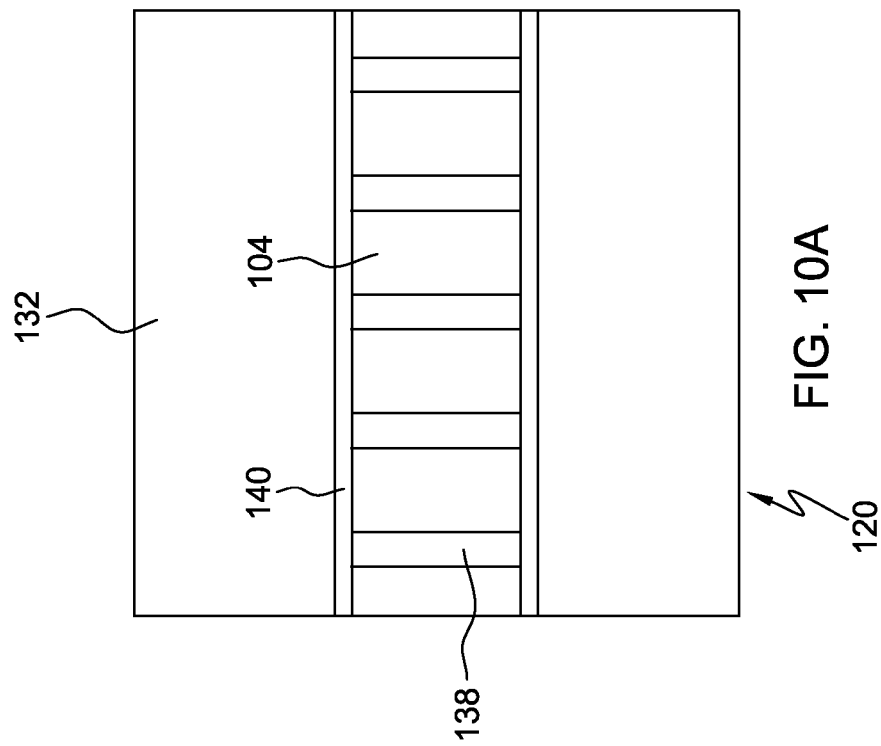
FIG. 10A is a top view of the structure of FIG. 9A

Views from the top of the nanowire mesh device 120 and PDSOI device 124 structure 100 are shown in FIGS. 10A and 10B, respectively. Within trench 134 on the nanowire mesh device 120 are shown the plurality of fins 138 each separated by a predetermined distance. The bottom of the trench 134 between the fins 138 includes the buried insulating layer 104. Within trench 134 on the PDSOI device 122 of structure 100 is semiconductor layer 144 which resulted from the etching down to top semiconductor layer 106 followed by epitaxial growth of additional semiconductor material, as described previously.

After forming the spacers 140, each layer of sacrificial material 112 from each fin 138 is selectively removed to release the layers of semiconductor materials, e.g., layers 106 and 110. The released layers of semiconductor material, e.g., 106 and 110 are now referred to herein as semiconductor nanowires 142. Each individual semiconductor nanowire 142 within trench 134 represents a channel, e.g., semiconductor nanowire channel, of the exemplary embodiments. The resultant structure including the now released semiconductor nanowires 142 is shown in FIG. 11A. It is noted that the structure shown in FIG. 11A includes a plurality of vertically stacked and spaced apart semiconductor nanowires 142, e.g., nanowire mesh, that are located within trench 134.

The removal of the layers of sacrificial material 112 from each fin 138 is achieved in exemplary embodiments by utilizing a chemical etchant that exploits the lower oxidation potential of the layers of sacrificial material 112 compared to the layers of semiconductor material 110 and 106. Examples of such etchants include, but are not limited to a 1:2:3 mixture of $HF:H_2O_2:CH_3COOH$, or a mixture of $H_2SO_4$ and $H_2O_2$.

The selective removal of the layers of sacrificial material 112 from each fin 138 may also be achieved by using a dry etching process such as $O_2$ plasma etching or plasma chemistries typically used for etching.

At this point of the present invention, a solid source diffusion anneal may be performed to dope each of the remaining layers of semiconductor material, that is, 106 and 110 outside trench 134 in first portion 120 and 144 outside trench 134 in second portion 122, within the source/drain regions.

Doping of the PDSOI device 122 in FIG. 11B may occur at the same time as the nanowire mesh device 120 or at a different time, depending on the dopants used.

A gate dielectric (not specifically shown in the drawings) may be formed into the trench 134 onto nanowire mesh device 120 and PDSOI device 122 utilizing a conventional deposition process or a thermal growth process. The gate dielectric may be a low k gate dielectric, i.e., an insulating material having a dielectric constant of less than silicon dioxide; silicon dioxide; or a high k gate dielectric, i.e., an insulator having a dielectric constant greater than silicon dioxide.

Next, a replacement gate 146 is formed over each of the semiconductor nanowires 142 and semiconductor layer 144 by filling trench 134 with a gate material. Once the gate material is filled into the trench 134, planarization such as, for example, chemical mechanical polishing is used to planarize the replacement gate 146 and stopping on the spacers 140 to result in the structures shown in FIGS. 12A and 12B. Suitable gate materials include but are not limited to, one or more layer of materials such as polysilicon, silicon germanium, an elemental metal, an alloy of an elemental metal, a metal nitride and/or a metal silicide.

Thereafter, the sacrificial layer material 132 may be removed (not shown) from the nanowire mesh device 120 and PDSOI device 124, for example by a selective etching process, followed by conventional processing for source/drain implants, silicide formation, contact via formation and metallization layers. An interlayer dielectric then may be conventionally deposited to replace the sacrificial layer material 132 that has been removed.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor hybrid structure on a semiconductor on insulator (SOI) substrate comprising:
   a first portion of the SOI substrate containing at least one nanowire mesh device and a second portion of the SOI substrate containing at least one partially depleted semiconductor on insulator (PDSOI) device;
   the at least one nanowire mesh device comprising:
   a plurality of vertically stacked and vertically spaced apart semiconductor nanowires located on a surface of the SOI substrate, each semiconductor nanowire having two end segments in which one of the end segments is connected to a source region and the other end segment is connected to a drain region; and a gate region including a gate dielectric and a gate conductor over at least a portion of the plurality of vertically stacked and vertically spaced apart semiconductor nanowires, wherein each source region and each drain region is self-aligned with the gate region;
   the at least one PDSOI device comprising:
   a partially depleted semiconductor layer on the SOI substrate; and a gate region including a gate dielectric and a gate conductor over at least a portion of the partially depleted semiconductor layer.

2. The semiconductor hybrid structure of claim 1 wherein each of said semiconductor nanowires has a pitch of less than 200 nm and a width of less than 40 nm.

3. The semiconductor hybrid structure of claim 1 wherein each of said semiconductor nanowires comprises a Si-containing semiconductor material.

4. The semiconductor hybrid structure of claim 1 further comprising a spacer located adjacent to the gate region in the first and second portions of the SOI substrate.

5. The semiconductor hybrid structure of claim 4 wherein each spacer comprises a material selected from the group consisting of a nitride, an oxynitride and an oxide.

6. The semiconductor hybrid structure of claim 1 wherein the first portion of the SOI substrate containing a plurality of nanowire mesh devices and the second portion of the SOI substrate containing a plurality of PDSOI devices.

7. The semiconductor hybrid structure of claim 1 wherein the SOI substrate comprises a semiconductor base, a buried insulating layer and a top semiconductor layer such that a thickness of the top semiconductor layer in the second portion is greater than the top semiconductor layer in the first portion.

8. The semiconductor hybrid structure of claim 7 wherein the thickness of the top semiconductor layer in the second portion is 60 to 90 nanometers and the thickness of the top semiconductor layer in the first portion is 30 to 90 nanometers.

9. The semiconductor hybrid structure of claim 1 wherein the SOI substrate comprises a plurality of SOI chips and wherein the at least one nanowire mesh device and the at least one PDSOI device are on the same chip.

10. The semiconductor hybrid structure of claim 9 wherein the at least one nanowire mesh device is adjacent to the at least one PDSOI device.

11. A semiconductor hybrid structure on a semiconductor on insulator (SOI) substrate comprising:
    a first portion of the SOI substrate containing at least one nanowire mesh device and a second portion of the SOI substrate containing at least one partially depleted semiconductor on insulator (PDSOI) device;
    the at least one nanowire mesh device comprising:
    a plurality of stacked and spaced apart semiconductor nanowires located on the SOI substrate, each semiconductor nanowire having two end segments in which one of the end segments is connected to a source region and the other end segment is connected to a drain region; and a gate region over at least a portion of the plurality of stacked and spaced apart semiconductor nanowires, wherein each source region and each drain region is self-aligned with the gate region;
    the at least one PDSOI device comprising:
    a partially depleted semiconductor layer on the substrate; and a gate region and a gate conductor over at least a portion of the partially depleted semiconductor layer.

12. An integrated circuit comprising:
    a semiconductor hybrid structure on a semiconductor on insulator (SOI) substrate, the semiconductor hybrid structure comprising:
    first portions of the SOI substrate containing a plurality of nanowire mesh devices and second portions of the SOI substrate containing a plurality of partially depleted semiconductor on insulator (PDSOI) devices;
    each of the plurality of nanowire mesh devices comprising:

a plurality of vertically stacked and vertically spaced apart semiconductor nanowires located on a surface of the SOI substrate, each semiconductor nanowire having two end segments in which one of the end segments is connected to a source region and the other end segment is connected to a drain region; and a gate region including a gate dielectric and a gate conductor over at least a portion of the plurality of vertically stacked and vertically spaced apart semiconductor nanowires, wherein each source region and each drain region is self-aligned with the gate region;

each of the plurality of PDSOI devices comprising:

a partially depleted semiconductor layer on the SOI substrate; and a gate region including a gate dielectric and a gate conductor over at least a portion of the partially depleted semiconductor layer.

13. The integrated circuit of claim 12 wherein each of said semiconductor nanowires has a pitch of less than 200 nm and a width of less than 40 nm.

14. The integrated circuit of claim 12 wherein each of said semiconductor nanowires comprises a Si-containing semiconductor material.

15. The integrated circuit of claim 12 further comprising a spacer located adjacent to the gate region in the first portions and second portions of the SOI substrate.

16. The integrated circuit of claim 12 wherein each spacer comprises a material selected from the group consisting of a nitride, an oxynitride and an oxide.

17. The integrated circuit of claim 12 wherein the SOI substrate comprises a semiconductor base, a buried insulating layer and a top semiconductor layer such that a thickness of the top semiconductor layer in the second portions is greater than the top semiconductor layer in the first portions.

18. The integrated circuit of claim 17 wherein the thickness of the top semiconductor layer in the second portions is 60 to 90 nanometers and the thickness of the top semiconductor layer in the first portions is 30 to 90 nanometers.

19. The integrated circuit of claim 12 wherein the SOI substrate comprises a plurality of SOI chips and wherein there is at least one nanowire mesh device and at least one PDSOI device on the same SOI chip.

20. The integrated circuit of claim 19 wherein the at least one nanowire mesh device is adjacent to the at least one PDSOI device.

* * * * *